United States Patent
Huang et al.

(10) Patent No.: US 9,083,342 B2
(45) Date of Patent: Jul. 14, 2015

(54) CIRCUIT AND METHOD FOR POWER MANAGEMENT

(71) Applicant: TAIWAN SEMICONDUCTOR MANUFACTURING COMPANY LTD., Hsinchu (TW)

(72) Inventors: Chia-En Huang, Hsinchu County (TW); I-Han Huang, Tainan (TW); Fu-An Wu, Hsinchu (TW); Jung-Ping Yang, Hsin-Chu County (TW); Cheng Hung Lee, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 13/969,888

(22) Filed: Aug. 19, 2013

(65) Prior Publication Data
US 2015/0048869 A1   Feb. 19, 2015

(51) Int. Cl.
G05F 1/10   (2006.01)
G05F 3/02   (2006.01)
H03K 17/22  (2006.01)

(52) U.S. Cl.
CPC .................................. *H03K 17/223* (2013.01)

(58) Field of Classification Search
USPC ........................... 327/530–546; 323/312–317
See application file for complete search history.

(56) References Cited

U.S. PATENT DOCUMENTS

| | | | |
|---|---|---|---|
| 6,208,171 B1 * | 3/2001 | Kumagai et al. | 326/121 |
| 6,313,695 B1 * | 11/2001 | Ooishi et al. | 327/544 |
| 7,219,244 B2 * | 5/2007 | Kuang et al. | 713/320 |
| 7,266,707 B2 * | 9/2007 | Ngo et al. | 713/300 |
| 7,532,036 B2 * | 5/2009 | Fujikawa et al. | 326/98 |
| 7,696,649 B2 * | 4/2010 | Frey et al. | 307/141 |
| 8,456,199 B2 * | 6/2013 | Yeung et al. | 327/108 |
| 2008/0309369 A1 * | 12/2008 | Sakata et al. | 326/34 |
| 2010/0109702 A1 * | 5/2010 | Sakata et al. | 326/34 |

\* cited by examiner

*Primary Examiner* — Brandon S Cole
(74) *Attorney, Agent, or Firm* — WPAT, P.C.; Anthony King; Kay Yang

(57) ABSTRACT

A method comprises identifying a number of power domains in a device, connecting the power domains to each other by a number of control devices during a wake-up mode of the device, and disconnecting the power domains after the wake-up mode of the device.

19 Claims, 10 Drawing Sheets

CIRCUIT AND METHOD FOR POWER MANAGEMENT

TECHNICAL FIELD

The present disclosure is generally related to power management.

BACKGROUND

In a system on chip (SOC) application, the system dynamically powers down unused sections and powers up those sections when they are accessed. In some circuit designs, when a section is not active, such as when the section is powered down, headers and/or footers are deactivated or turned off to cut off the leakage paths from a power supply, including a high voltage power supply VDD or a low voltage power supply VSS. Further, the headers and footers are activated to enable normal operation of a section when the section is activated from an inactive state in a wake-up process.

In some circuit designs, a power domain including headers or footers is separated from another power domain. To wake up different power domains in a chip, in some approaches, individual power domains are sequentially powered on in a daisy chain manner. The daisy chain mechanism causes a relatively complex circuit design and more area penalty.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
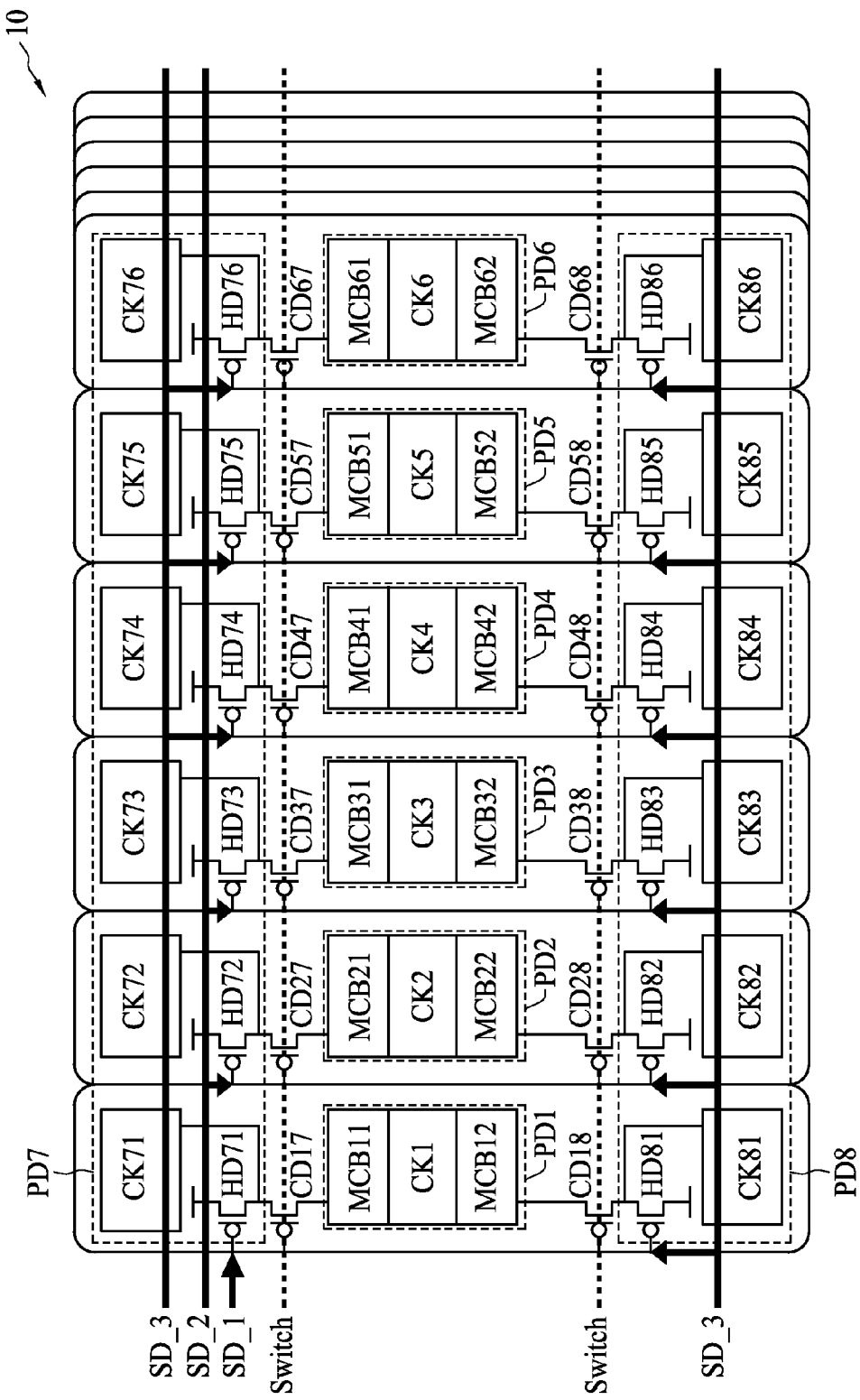
FIG. 1 is a circuit diagram of a memory macro, in accordance with some embodiments.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when an element is referred to as being "connected to" or "coupled to" another element, it may be directly connected to or coupled to the other element, or intervening elements may be present.

Some embodiments have one or a combination of the following features and/or advantages. In some embodiments, individual power domains in a device are connected together in a wake-up mode, and headers associated with the power domains are turned on by stages. A number of headers turned on at each stage is determined based on a total current of conducting headers with reference to a predetermined peak current of a chip. Therefore, compared to other approaches, a wake-up time of the device is reduced and control circuits of the headers have a smaller area.

Power Management Circuit in a Memory Macro

FIG. 1 is a circuit diagram of a memory macro 10, in accordance with some embodiments. Memory macro 10 comprises memory core banks MCB11, MCB21 to MCB61, memory core banks MCB12, MCB22 to MCB62, and control circuits CK1, CK2 to CK6 that work in power domains PD1, PD2 to PD6, respectively. The memory macro 10 further comprises control circuits CK71, CK72 to CK76, and headers HD71, HD72 to HD76 that work in a power domain PD7; and control circuits CK81, CK82 to CK86, and headers HD81, HD82 to HD86 that work in a power domain PD8. The memory macro 10 further comprises control devices CD17, CD27 to CD 67 connecting the power domains PD1, PD2 to PD6 to the power domain PD7, respectively; and control devices CD18, CD28 to CD68 connecting the power domains PD1, PD2 to PD6 to the power domain PD8, respectively. The memory macro 10 is a static random access memory (SRAM) macro in a chip in some embodiments. For simplicity, only one memory macro 10 having twelve memory core banks MCB11 to MCB61 and MCB12 to MCB62 are shown. Nevertheless, the memory macro 10 comprising other types of memories and a different number of memory core banks is also within the contemplated scope of the present disclosure.

The memory core banks MCB11, MCB21 to MCB61 are accessed via the control circuits CK71, CK72 to CK76, respectively. In some embodiments, the control circuits CK71, CK72 to CK76 include local interface circuits, for example, local input/output (LIO) circuits. The control circuits CK71, CK72 to CK76 are connected to a first LIO signal line (not shown) or a complemented first LIO signal line (not shown). The first LIO signal line and the complemented first LIO signal line are connected together before data sensing of the memory core banks MCB11, MCB21 to MCB61. The control circuits CK71, CK72 to CK76 are in the same power domain PD7.

The control circuits CK71, CK72 to CK76 correspond to the headers HD71, HD72 to HD76, respectively. The headers HD71, HD72 to HD76 are in the same power domain PD7, as their corresponding control circuits CK71, CK72 to CK76. Further, the headers HD71, HD72 to HD76 serve as power gates to control power supplied to the control circuits CK71, CK72 to CK76, respectively. In some embodiments as illustratively shown in FIG. 1, the headers HD71, HD72 to HD76 each includes a p-type metal-oxide-semiconductor (PMOS) transistor. Further, a gate of the header HD71 receives a control signal SD_1, gates of the headers HD72 and HD73 receive a control signal SD_2, and gates of the headers HD74, HD75 and HD76 receive a control signal SD_3. Sources of the headers HD71, HD72 to HD76 are configured to receive a power voltage, for example, VDD (not labeled). Drains of the headers HD71, HD72 to HD76 are connected to a power node to which the control circuits CK71, CK72 to CK76 are connected to. For example, the power node connects the first LIO signal line and the complemented first LIO signal line before data sensing of the memory core banks MCB11, MCB21 to MCB 61.

The memory core banks MCB12, MCB22 to MCB62 are accessed via the control circuits CK81, CK82 to CK86, respectively. In some embodiments, the control circuits CK81, CK82 to CK86 include local interface circuits, for example, LIO circuits. The control circuits CK81, CK82 to CK86 are connected to a second LIO signal line or a complemented second LIO signal line. The second LIO signal line and the complemented second LIO signal line are connected together before data sensing of the memory core banks MCB12, MCB22 to MCB62. The control circuits CK 81, CK82 to CK86 are in the same power domain PD8.

The control circuits CK81, CK82 to CK86 correspond to the headers HD81, HD82 to HD86, respectively. The headers HD81, HD82 to HD86 are each in the same power domain PD8, as their corresponding control circuits CK81, CK82 to CK86. Further, the headers HD81, HD82 to HD86 serve as power gates to control power supplied to the control circuits CK81, CK82 to CK86, respectively. In some embodiments as illustratively shown in FIG. 1, the headers HD81, HD82 to HD86 each includes a PMOS transistor. Further, gates of the headers HD81, HD82 to HD86 receive the control signal SD_3. Effectively, the gates of the headers HD74 to HD76 and of the headers HD81 to HD86 receive the same control signal SD_3. Sources of the headers HD81, HD82 to HD86 are configured to receive the power voltage VDD. Drains of the headers HD81, HD22 to HD62 are connected to a power node to which the control circuits CK81, CK82 to CK86 are connected to. For example, the power node connects the second LIO signal line and the second complemented LIO signal line before data sensing of the memory core banks MCB12, MCB22 to MCB62. In some embodiments, the first LIO signal line, the complemented first LIO signal line, the second LIO signal line and the complemented second LIO signal line are coupled together to the power nodes before data sensing of the memory core banks MCB11, MCB21 to MCB61 and the memory core banks MCB12, MCB22 to MCB62.

The control signals SD_1, SD_2 and SD_3, and the number of headers configured to receive the corresponding control signal SD_1, SD_2 or SD_3 will be discussed with reference to FIGS. 2A to 4.

The control circuits CK1, CK2 to CK6 are configured to facilitate operation of the memory core banks MCB11, MCB21 to MCB61 and memory core banks MCB12, MCB22 to MCB62. For example, the control circuit CK1 is between the memory core banks MCB11 and MCB12, and facilitates the operation of the memory core banks MCB11 and MCB12. For another example, the control circuit CK2 is between the memory core banks MCB21 and MCB22, and facilitates the operation of the memory core banks MCB21 and MCB22. In some embodiments, the control circuits CK1, CK2 to CK6 are configured to assist the write operation of corresponding memory core banks. In some embodiments, the control circuits CK1, CK2 to CK6 are configured to serve a number of corresponding memory core banks different from as illustratively shown in FIG. 1. For example, each of the control circuits CK1, CK2 to CK6 serves more than two memory core banks. For another example, each of the control circuits CK1, CK2 to CK6 serves a single memory core bank. In brief, other numbers of memory core banks sharing one of the control circuits CK1, CK2 to CK6 also fall within the contemplated scope of the disclosure.

The control circuits CK1, CK2 to CK6 each operate in a different and corresponding power domain PD1, PD2 or PD6. However, each of the control circuits CK1, CK2 to CK6 and its corresponding memory core banks work in a same power domain. As an example, the control circuit CK1 and its corresponding memory core banks MCB11 and MCB12 operate in the power domain PD1, the control circuit CK2 and its corresponding memory core banks MCB21 and MCB22 operate in the power domain PD2, and the control circuit CK3 and its corresponding memory core banks MCB31 and MCB32 operate in the power domains PD3, etc.

In the memory macro 10, during a wake-up mode, different power domains PD1 to PD8 are connected to each other to facilitate centralized wake-up control. In contrast, after the wake-up mode is completed, different power domains PD1 to PD8 are disconnected from each other so that these power domains do not interfere with each other during normal operation of the memory macro 10.

The control devices CD17, CD27 to CD67 are configured to control electrical connection and disconnection between corresponding power domains. For example, the control device CD17 controls electrical connection and disconnection between power domains PD1 and PD7, the control device CD27 controls electrical connection and disconnection between power domains PD2 and PD7, etc. In some embodiments as illustratively shown in FIG. 1, the control devices CD17, CD27 to CD67 each comprises a PMOS transistor, which serves as a switching device. Gates of the control devices CD17, CD27 to CD67 are coupled together and receive a control signal Switch. Sources of the control devices CD17, CD27 to CD67 are connected to the drains of the headers HD71, HD72 to HD76, respectively. Drains of the control devices CD17, CD27 to CD67 are connected to power nodes in the power domain PD1, PD2 to PD6, respectively. For example, the gate of the control device CD17 is configured to receive the control signal Switch and is connected to the gates of the other control devices CD27 to CD67. The source of the control device CD17 is connected to the drain of the header HD71 and the power node to which the control circuit CK71 is connected. The source of the control device CD17 is connected to the power node that the control circuit CK1 is connected to in the power domain PD1.

Similarly, the control devices CD18, CD28 to CD68 are configured to control electrical connection and disconnection between corresponding power domains. For example, the control device CD18 controls electrical connection and disconnection between power domains PD1 and PD8, the control device CD28 controls electrical connection and disconnection between power domains PD2 and PD8, etc. In some embodiments as illustratively shown in FIG. 1, the control devices CD18, CD28 to CD68 each comprises a PMOS transistor, which serves as a switching device. Gates of the control devices CD18, CD28 to CD68 are coupled together to receive the control signal Switch. Sources of the control devices CD18, CD28 to CD68 are connected to the drains of headers HD81, HD82 to HD86, respectively. Drains of the control devices CD18, CD28 to CD68 are connected to the power nodes in the power domains PD1, PD2 to PD6, respectively.

For example, the gate of the control device CD18 is configured to receive the control signal Switch and is connected to the gates of the other control devices CD28 to CD68. The source of the control device CD18 is connected to the drain of the header HD81 and the power node to which the control circuit CK81 is connected. The source of the control device CD18 is connected to the power node that the control circuit CK1 is connected to in the power domain PD1.

In FIG. 1, in response to a state of the control signal Switch, the control devices CD17, CD27 to CD67 and the control devices CD18, CD28 to CD68 are turned on or turned off at substantially the same time. In some embodiments, the control devices CD17, CD27 to CD67 and the control devices CD18, CD28 to CD68 are turned on during a wake-up mode of the memory macro 10. In some embodiments, the control devices CD17, CD27 to CD67 and the control devices CD18, CD28 to CD68 are turned off after the wake-up mode of the memory macro 10. As illustratively shown in FIG. 1, the control signal SD_1 is used to control the header HD71, the control signal SD_2 is used to control the headers HD72 and HD73, and the control signal SD_3 is used to control the headers HD74 to HD76 and the headers HD81 to HD86. Effectively, the control signals SD_1, SD_2, and SD_3 are used to control one, two, and nine headers, respectively. However, a control signal SD_1, SD_2, and/or SD_3 may be used to control a number of headers different from the corresponding one, two, and nine headers. As a result, a control signal SD_1, SD_2, or SD_3 may be used to control a same or a different number of headers. Further, a number of control signals different from the three control signals, SD1, SD_2, and SD_3, may be used to control the headers HD71 to HD76 and the headers HD81 to HD86.

In some embodiments, the control signals SD_1, SD_2 and SD_3 are activated one after another at a different corresponding time point or stage. Consequently, the headers HD71 to HD76 and the headers HD81 to HD86 are turned on at different time points or stages, which are discussed with reference to FIG. 2A below.

Simulation

Figure 2A:
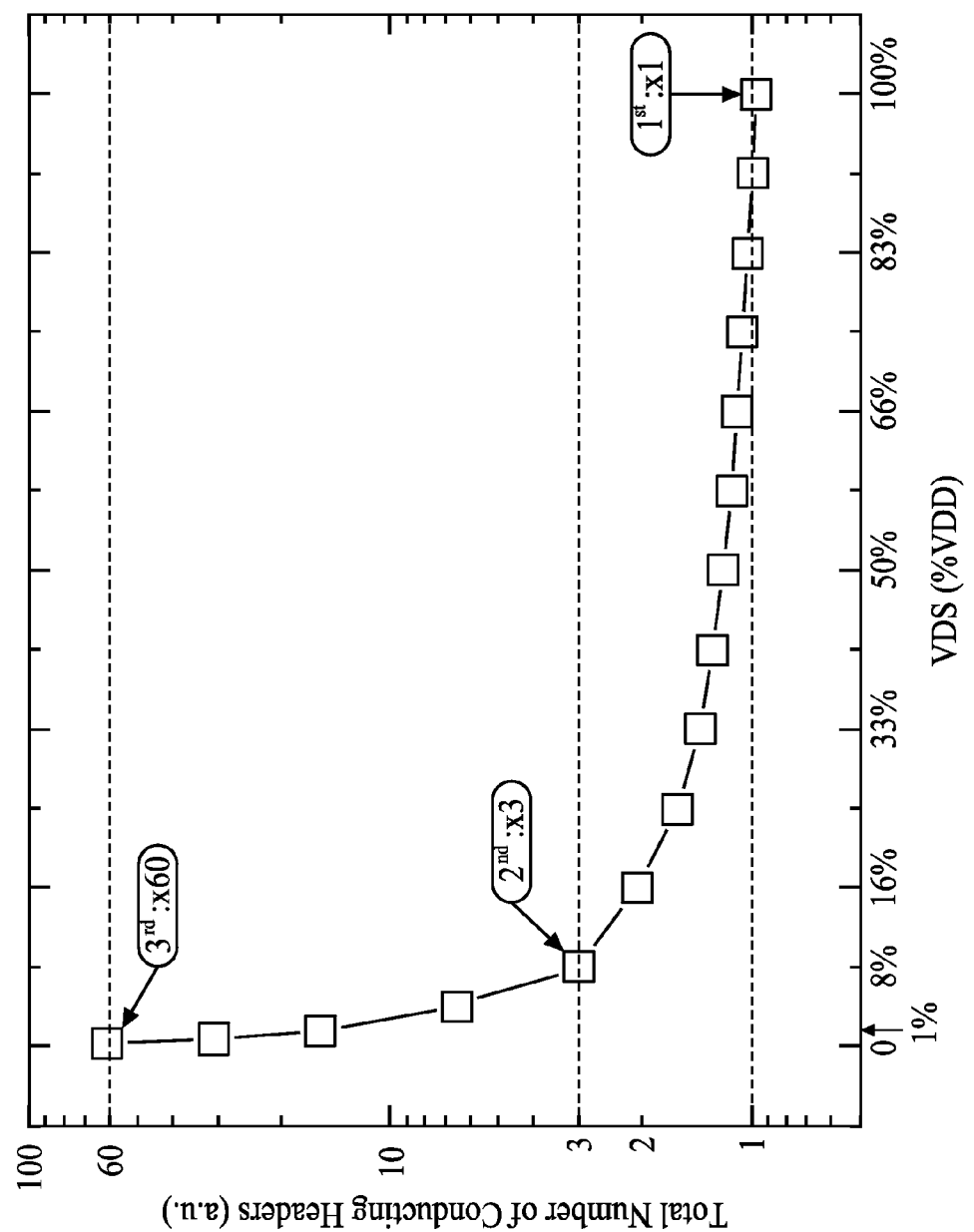
FIG. 2A is a graph showing a relationship between the number of headers to be turned on and VDS across a drain and source of each header in the memory macro of FIG. 1 based on a simulation, in accordance with some embodiments.

FIG. 2A is a graph 20 showing a relationship between the number of headers to be conducting in each stage and VDS across a drain and a source of the headers HD71 to HD76 and HD81 to HD86 in the memory macro 10 of FIG. 1 based on a simulation, in accordance with some embodiments. Because the sources of the headers HD71 to HD76 and HD81 to HD86 are connected together to receive the supply voltage VDD and the drains of the headers HD71 to HD76 and HD81 to HD86 are connected together to the coupled power nodes in power domains PD7 and PD8, VDS across the drains and sources of the headers HD71 to HD76 and HD81 to HD86 are the same. Further, because the drains of the headers HD71 to HD76 and HD81 to HD86 are coupled to the power nodes in the power domains PD7 and PD8, VDS is also a voltage drop across the power nodes and the sources of the headers HD71 to HD76 and HD81 to HD86. In some embodiments, the headers HD71 to HD76 and HD81 to HD86 are PMOSs, and VDS is an absolute value. The vertical axis represents the total number of conducting headers in logarithms in arbitrary unit, and the horizontal axis represents VDS across the conducting headers in percentage of VDD.

In the simulation shown in FIG. 2, the curve of VDS versus the total number of conducting headers are generated based on the following conditions:

$I_{total}(m)$ is maximized such that $$I_{total}(m)=m\times I_{unit}(VDS) \text{ and}$$

$$I_{total}(m) \leq IMAX$$

where $I_{total}(m)$ is the total current flowing in the conducting headers in the memory macro 10, m is the total number of conducting headers, and $I_{unit}$ is a current flowing in one header, and IMAX is a predetermined peak current of the memory macro 10. The current $I_{unit}$ is a function of VDS of the header and can be expressed as $I_{unit}(VDS)$. As VDS decreases, such as from 100% of VDD to 0% of VDD, the header first operates in a saturation mode and then in a linear mode. Effectively, $I_{unit}(VDS)$ decreases as VDS decreases because the current $I_{unit}(VDS)$ in the linear mode is less than that in the saturation mode Further, under the saturation mode, $I_{unit}(VDS)$ decreases slowly with respect to the decrease of VDS when the early effect is considered. Under the linear mode, $I_{unit}(VDS)$ decreases faster with respect to VDS. In some embodiments, the total current $I_{total}(m)$ of the conducting headers is maximized so that the power nodes at the drains of the headers HD71 to HD76 and HD81 to HD86 are quickly charged to VDD at the sources of the headers HD71 to HD76 and HD81 to HD86. In order to maximize $I_{total}(m)$ under the constraint $I_{total}(m) \leq IMAX$, in various embodiments of the present disclosure, the total number m of conducting headers is increased as $I_{unit}(VDS)$ decreases and VDS decreases. In some embodiments, $I_{total}(m)$ is kept as close as possible to, but is less than, the predetermined peak current IMAX.

Further, in some embodiments, the conducting headers are turned on in a stage-by-stage manner. For each stage, a number of headers is turned on such that the total current $I_{total}(m)$ of the conducting headers is as close as possible to, but is less than, the predetermined peak current IMAX. As illustrated in FIG. 2A, the conducting headers are tuned on in three stages. The stages are identified at points on the curve of the graph 20 of FIG. 2A, where additional number of headers can be turned on so that the total current $I_{total}(m)$ is maximized under the constraint of being less than the predetermined peak current IMAX. For example, one header can be turned on at the first stage when VDS equals 100% of VDD, two additional headers can be turned on at the second stage when VDS equals 8% of VDD, and fifty seven additional headers can be turned on at the third stage when VDS equals 1% of VDD. In some embodiments, the number of stages is determined considering a tradeoff between maintaining the total current $I_{total}(m)$ as close as possible to the peak current IMAX and keeping the corresponding control circuits for the headers relatively less complex. The benefits of increasing the number of stages are discussed in detail with reference to FIGS. 5 to 6B. In contrast, in other approaches, a fixed number of headers with a total current that is smaller than a predetermined peak current is turned on one after another. Without adjusting the headers to be turned on for each stage as in the present disclosure, a wake-up time in other approaches is longer.

Figure 2B:
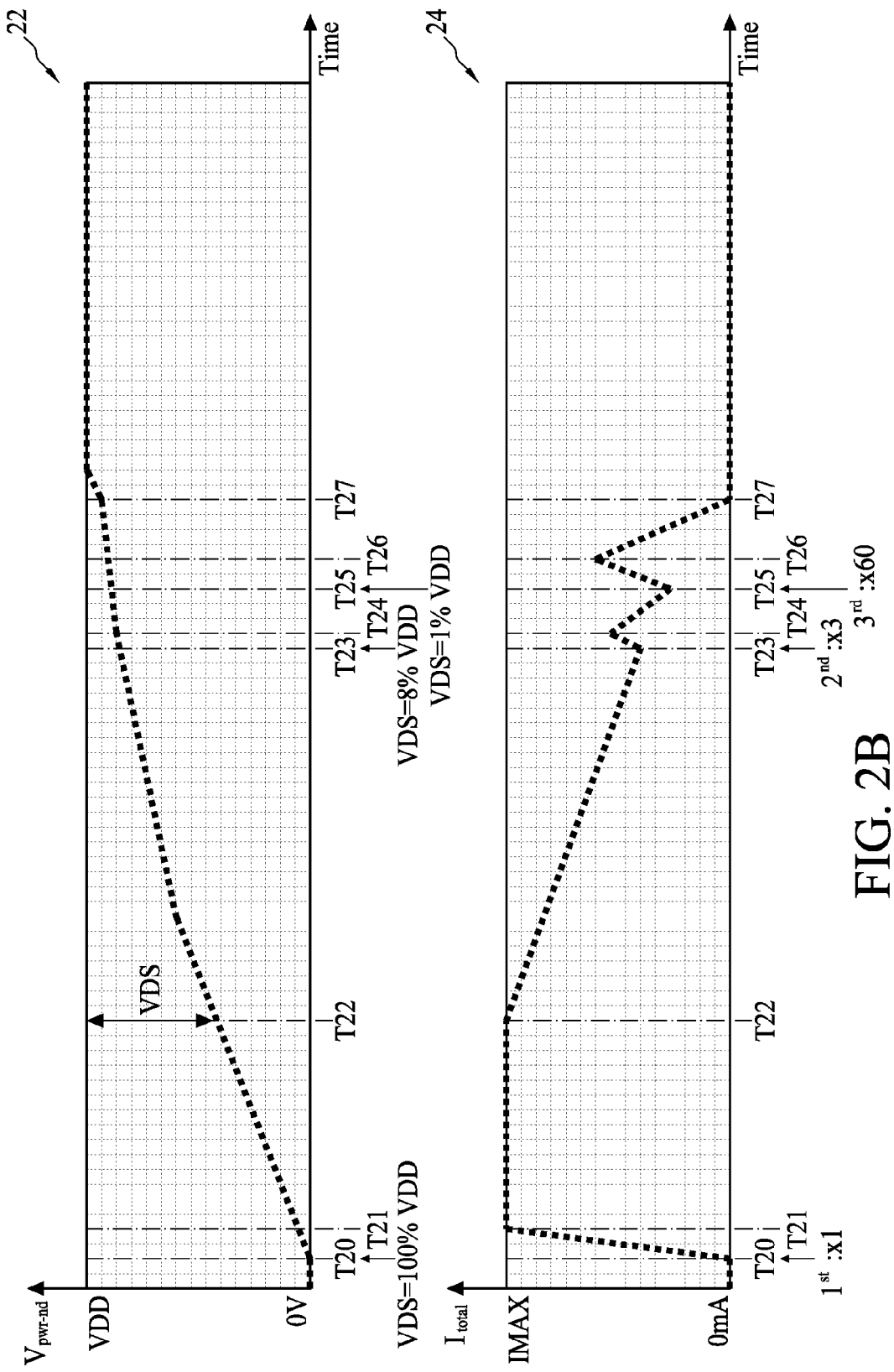
FIG. 2B are graphs showing a transition of a voltage of a power node during a wake-up mode and the corresponding total current in conducting headers of the memory macro in FIG. 1, in accordance with some embodiments.

FIG. 2B are graphs 22 and 24, in accordance with some embodiments. Graph 22 shows a transition of a voltage $V_{pwr\_nd}$ of the power nodes during a wake up mode while graph 24 shows the corresponding total current $I_{total}(m)$ flowing in the conducting headers of the memory macro 10 in FIG. 1. The headers that are turned on and conducting charge the power nodes collectively with the total current $I_{total}(m)$ corresponding to VDS of the headers. Before the wake-up mode at time point T20, the power nodes are not charged, and the voltage $V_{pwr\_nd}$ is at 0V. One header HD71 in FIG. 1 is turned on in the first stage at time point T20. As explained below, because one header HD71 is turned on between time point T20 and time point T23, the current $I_{unit}$ of HD71 between time point T20 and time point T23 is $I_{total}$(m) where m equals to 1. Further, at time point T20, because the voltage $V_{pwr\_nd}$ is at 0V, VDS of the header HD71 is equal to 100% of VDD, and the header HD71 charges the power nodes with a saturation current $T_{unit}$. In some embodiments, as illustratively shown in FIG. 2B, the predetermined peak current IMAX is set to be equal to the saturation current $I_{unit}$ of the header HD71. As the voltage $V_{pwr\_nd}$ rises, VDS decreases, the header HD71 changes operation from the saturation mode to the linear mode at time point T22. As a result, starting at time point T22, the current $I_{unit}$ of the conducting header HD71 decreases more significantly with the decrease of VDS. Effectively, the total current $I_{total}$(m) decreases, starting at time point T22.

At time point T23, VDS of the header HD71 drops to 8% of VDD, and the current $I_{unit}$ of the conducting header HD71, which is also $I_{total}$(m), decreases to a value where two additional headers HD72 and HD73 are turned on at the second stage so that a total of three conducting headers HD71, HD72 and HD73 charge the power node collectively, but the total current $I_{total}$(m) is less than IMAX. With two additional headers HD72 and HD73 being turned on at time point T23, the total current $I_{total}$(m) of the three conducting headers HD71, HD72 and HD73 rises up until time point T24. Because the headers HD71, HD72 and HD73 have the same VDS, the headers HD71, HD72, and HD73 are conducting under the linear mode. Hence, as VDS keeps dropping, the total current $I_{total}$(m) of the conducting headers HD71, HD72 and HD73 starts decreasing at time point T24.

At time point T25, VDS of the headers HD71, HD72 and HD73 drops to 1% of VDD, and the total current $I_{total}$(m) of the conducting headers HD71, HD72 and HD73 drops to a value where fifty seven additional headers including headers HD74 to HD76 and HD81 to HD86 can be turned on at the third stage so that a total of sixty conducting headers including HD71 to HD76 and HD81 to HD86 charge the power node collectively, but $I_{total}$(m) is still less than IMAX. With fifty seven additional headers turned on at time point T25, the total current $I_{total}$(m) of the sixty conducting headers rises up until time point T26. Because all of the sixty headers have the same VDS, all of them are conducting under the linear mode. Hence, as VDS keeps dropping, the total current $I_{total}$(m) of the sixty conducting headers starts decreasing at time point T26. At time point T27, the voltage $V_{pwr\_nd}$ of the power node reaches VDD, which means the power domains PD1 to PD8 are woken up and the power domains PD1 to PD8 are ready to be disconnected for completion of the wake-up mode. In the above illustration, even with 60 headers being turned on, the total current $I_{total}$(m) of 60 headers is still less than IMAX. Effectively, the total current $I_{total}$(m) of 16 headers HD71 to HD 76 and HD81 to HD86 is also less than IMAX, which satisfies the above conditions.

In the illustration with references to FIGS. 2A and 2B, the headers are equally sized. However, the present disclosure is not limited to such an implementation. Headers having different sizes are within the contemplated scope of the present disclosure. Effectively, regardless of how the headers are sized, when headers in each stage are turned on, in various embodiments of the present disclosure, $I_{total}$(m) is kept to be as total close as possible to, but is less than, IMAX.

Further, one header implemented by one transistor is also for illustration. A header may be implemented by more than one transistor coupled in series and/or parallel. For illustration, in such an implementation, a header corresponds to a header unit. The current $I_{unit}$ illustrated above in one header corresponds to the total current of the more than one transistor in the header unit.

For illustration, a header unit has two headers. As a result, in some embodiments, the predetermined peak current IMAX is set to 2 times the saturation current of one header. As a result, two headers, for example, headers HD71 and HD72, are turned on in the first stage when VDS equals VDD. Four additional headers are turned on in the second stage as VDS decreases to approximately 8% of VDD, and one hundred and fourteen additional headers are turned on in the third stage as VDS decreases to approximately 1% of VDD. As the number of headers to be turned on in each stage changes, gates of corresponding headers are reconfigured to receive the corresponding control signals SD_1, SD_2, and SD_3 accordingly. Two headers in a header unit are used for illustration. A different number of headers are within the scope of the present disclosure. Further, different sizes of transistors in a header unit are also within the contemplated scope of the disclosure. The above values of IMAX are used for illustration. As the current in a header unit changes, a value for IMAX is changed accordingly. In brief, different values of IMAX are within the contemplated scope of the present disclosure.

In some embodiments, with the number of stages and the corresponding VDS determined, using FIG. 2A, transitions of VDS and the total current $I_{total}$(m) of the conducting headers as illustratively shown in corresponding graphs 22 and 24 in FIG. 2B can be generated. The corresponding delay between stages is then determined by identifying VDS on the graph 22 of FIG. 2B corresponding to VDS selected for stages using FIG. 2A and measuring the delay between the identified VDS. For example, based on FIG. 2A, the first, second and third stages are selected at VDS equals 100%, 8% and 1% of VDD, respectively. The total number of conducting headers for the first, second and third stages are 1, 3 and 60, respectively. Accordingly, the graphs 22 and 24 can be generated. By identifying VDS equals 100%, 8% and 1% of VDD happening at time points T20, T23 and T25 on graph 22, the delay between the first and second stages which equals T23-T20, and the delay between the second and third stages which equals T25-T23 can be determined. Accordingly, an amount of delay between activating the control signal SD_1 and activating the control signal SD_2 is set as the delay T23-T20, and an amount of delay between activating the control signal SD_2 and activating the control signal SD_3 is set as T25-T23, as will be discussed with reference to FIGS. 3 and 4.

Circuit for Power Management

Figure 3:
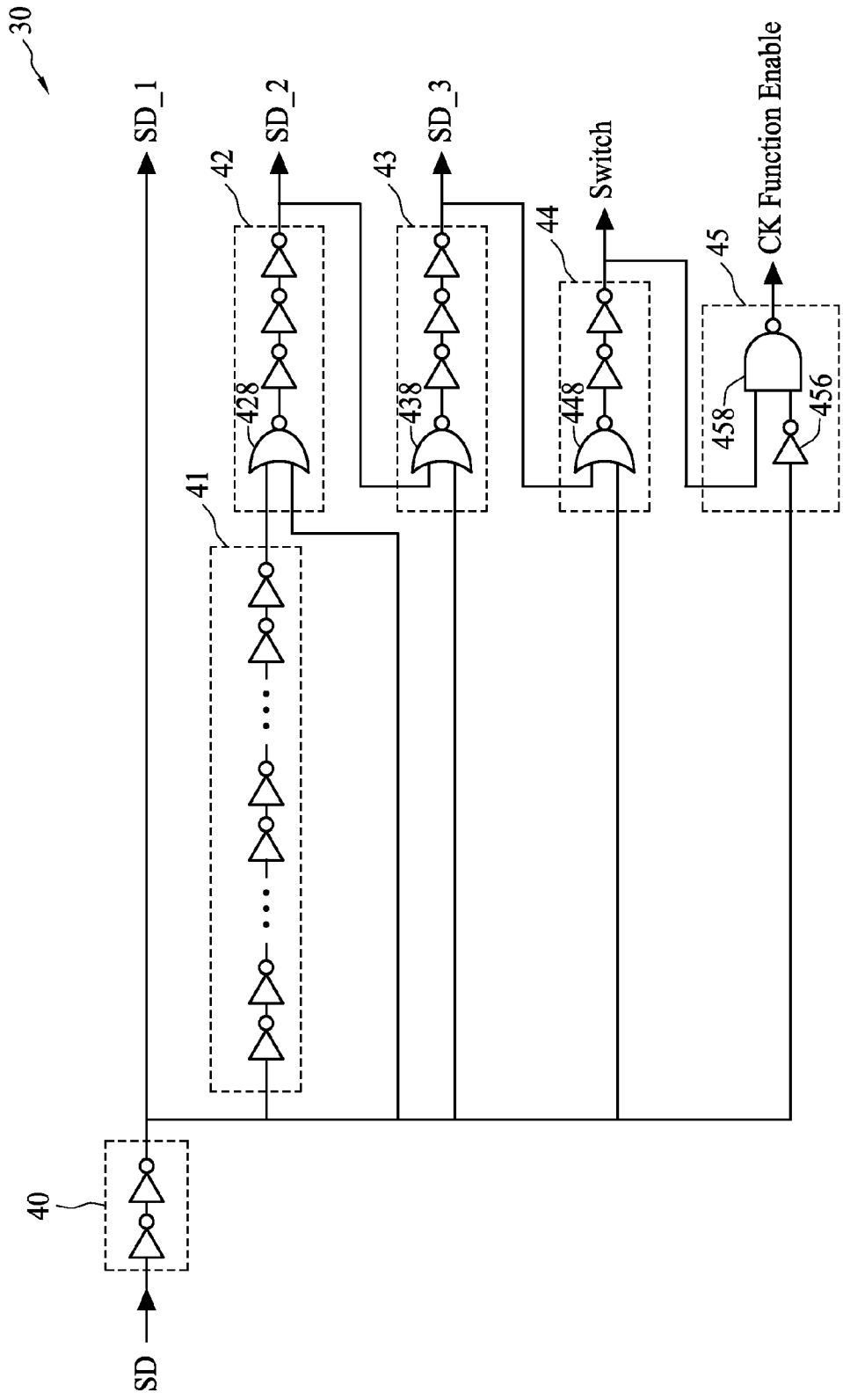
FIG. 3 is a diagram illustrating a circuit for power management, in accordance with some embodiments.

FIG. 3 is a diagram of a circuit 30 for power management, in accordance with some embodiments. Circuit 30 comprises delay control circuits 40 to 44 to generate the control signals SD_1, SD_2, SD_3, and Switch in FIG. 1 and the delay between stages in FIG. 3. The circuit 30 also comprises a delay control circuit 45 for disabling and enabling functions in each power domain before connecting the power domains to each other for entering the wake-up mode and for disconnecting the power domains after the wake-up mode finishes.

As shown in FIG. 3, an input of the delay control circuit 40 receives a master control signal SD from a central control circuit (not shown), and an output of the delay control circuit 40 generates the control signal SD_1. Further, the output of the delay control circuit 40 is connected to an input of the delay control circuits 41 to 45. In some embodiments, the delay control circuit 40 includes two inverters serially connected. By operation of the delay control circuit 40, the control signal SD_1 is the same as the master control signal SD except for a delay caused by the delay control circuit 40.

An input of the delay control circuit 41 is connected to the output of the delay control circuit 40. An output of the delay control circuit 41 is connected to an input of the delay control circuit 42. In some embodiments, the delay control circuit 41 includes an even number of inverters, for example, sixty inverters serially connected.

An input of the delay control circuit 42 receives the output of the delay control circuit 41. Another input of the delay control circuit 42 receives the output of the delay control circuit 40. An output of the delay control circuit 42 generates the control signal SD_2, and is connected to an input of the delay control circuit 43. In some embodiments, the delay control circuit 42 includes a NOR gate 428 and three inverters serially connected. An input of the NOR gate 428 receives the output of the delay control circuit 41. Another input of the NOR gate 428 receives the output of the delay control circuit 40. An output of the NOR gate 428 is connected to an input of the three serially-connected inverters. An output of the three serially-connected inverters generates the control signal SD_2, and is connected to an input of the delay control circuit 43.

In operation, when the master control signal SD is logically high, the output of the delay control circuit 40 is logically high. Effectively, the control signal SD_1 becomes logically high after a delay caused by the delay control circuit 40. The NOR gate 428, in response to the logically high output from the delay control circuit 40, generates a logical low value regardless of the logical value at the output of delay control circuit 41. By operation of the three serially-connected inverters in the delay control circuit 42, the logical low value from the output of the NOR gate 428 becomes logically high at the output of delay control circuit 42. Accordingly, when the master control signal SD is logically high, the control signal SD_2 becomes logically high after delay caused by the delay control circuits 40 and 42, regardless of the logical state of the output of control circuit 41.

In contrast, when the master control signal SD is logically low, the output of the delay control circuit 40 is logically low. Effectively, the control signal SD_1 becomes logically low after a delay caused by the delay control circuit 40. In response to the logically low output from the delay control circuit 40, the delay control circuit 41 generates a logically low output. The delay control circuit 42, in response to the logically low outputs from delay control circuits 40 and 41, generates a logically low output. Accordingly, when master control signal SD is logically low, the control signal SD_2 becomes logically low after a delay caused by the delay control circuits 40, 41 and 42. Effectively, when the control signal SD_1 becomes logically low, the control signal SD_2 becomes logically low after a total amount of delay caused by delay control circuits 41 and 42. The delay between the first stage initiated by the first control signal SD_1 and the second stage initiated by the second control signal SD_2 is determined based on the time period as VDS decreases from a voltage corresponding to the first stage to a voltage corresponding to the second stage in FIG. 2B.

An input of the delay control circuit 43 receives the output of the delay control circuit 42. Another input of delay control circuit 43 receives the output of the delay control circuit 40. An output of the delay control circuit 43 generates the control signal SD_3, and is connected to an input of the delay control circuit 44. In some embodiments, the delay control circuit 43 includes a NOR gate 438 and three inverters serially connected. An input of the NOR gate 438 receives the output of the delay control circuit 42. Another input of the NOR gate 438 receives the output of the delay control circuit 40. An output of the NOR gate 438 is connected to an input of the three serially-connected inverters. An output of the three serially-connected inverters generates the control signal SD_3, and is connected to an input of the delay control circuit 44.

In operation, when the master control signal SD is logically high, the output of delay control circuit 40 is logically high. The NOR gate 438, in response to the logically high output from delay control circuit 40 generates a logical low value, regardless of the logical value at the output of delay control circuit 42. By operation of the three serially-connected inverters in delay control circuit 43, the logical low value from the output of the NOR gate 438 becomes logically high at the output of the delay control circuit 43. Accordingly, when the master control signal SD is logically high, the control signal SD_3 becomes logically high after a delay caused by the delay control circuits 40 and 43, regardless of the logical value at the output of delay control circuit 42.

In contrast, when the master control signal SD is logically low, the outputs of the delay control circuits 40 and 42 are logically low. In response to the logically low outputs from delay control circuits 40 and 42, the delay control circuit 43 generates a logically low output. Accordingly, when the master control signal SD is logically low, the control signal SD_3 becomes logically low after a delay caused by the delay control circuits 40, 41, 42 and 43. Further, when the control signal SD_2 becomes logically low, the control signal SD_3 becomes logically low after the delay caused by delay control circuit 43. The delay between the second stage initiated by the control signal SD_2 and the third stage initiated by the control signal SD_3 is determined based on a time period as VDS decrease from the voltage corresponding to the second stage to a voltage corresponding to the third stage in FIG. 2B.

An input of delay control circuit 44 receives the output of the delay control circuit 43. Another input of the delay control circuit 44 receives the output of the delay control circuit 40. An output of the delay control circuit 44 generates the control signal Switch, and is connected to an input of delay control circuit 45. In some embodiments, the delay control circuit 44 includes a NOR gate 448 and two inverters serially connected. An input of the NOR gate 448 receives the output of the delay control circuit 43. Another input of the NOR gate 448 receives the output of the delay control circuit 40. An output of the NOR gate 448 is connected to an input of the two serially-connected inverters. An output of the two serially-connected inverters generates the control signal Switch, and is connected to an input of the delay control circuit 45.

In operation, when the master control signal SD is logically high, the output of the delay control circuit 40 is logically high. The NOR gate 448, in response to the logically high output from the delay control circuit 40, generates a logical low value, regardless of the logical value at the output of the delay control circuit 43. By operation of the two serially-connected inverters in delay control circuit 44, the logical low value from the output of the NOR gate 448 becomes logically low at the output of delay control circuit 44. Accordingly, when the master control signal SD is logically high, the control signal Switch becomes logically low after a delay caused by the delay control circuits 40 and 44, regardless of the signal at the output of delay control circuit 43.

In contrast, when the master control signal SD is logically low, the outputs of delay control circuits 40 and 43 are logically low. In response to the logically low outputs from the delay control circuits 40 and 43, the delay control circuit 44 generates a logically high output. Accordingly, when the master control signal SD is logically low, the control signal Switch becomes logically high after a delay caused by the delay control circuits 40, 41, 42, 43 and 44.

An input of the delay control circuit 45 receives the output of delay control circuit 44. Another input of delay control circuit 45 receives the output of the delay control circuit 40. An output of the delay control circuit 45 generates an enable signal CK Function Enable. In some embodiments, the delay control circuit 45 includes an inverter 456 and a NAND gate 458. An input of the NAND gate 458 receives the output of delay control circuit 44. Another input of the NAND gate 458 receives a complemented output of delay control circuit 40 from the inverter 456. An output of the NAND gate 458 generates the enable signal CK Function Enable.

In operation, when the master control signal SD is logically high, the output of the delay control circuit 40 is logically high. The inverter 456 receiving the output of the delay control circuit 40 generates a logical low value. Upon receiving the logical low value from the output of the inverter 456 as one input, the NAND gate 458 generates a logical high value at its output regardless of the other input of the NAND gate 458.

In contrast, when the master control circuit is logically low, the output of the inverter 456 and the delay control circuit 44 are logically high. In response to the logically high values from the inverter 456 and the delay control circuit 44, the delay control circuit 45 generates a logically low output. Accordingly, when the master control signal SD is logically low, the enable signal CK Function Enable is logically low after a delay caused by the delay control circuits 40, 41, 42, 43 and 44.

The circuit 30 in FIG. 3 is exemplary. For example, the number of inverters in the delay control circuits 41 to 43 can be designed to be different from what is illustrated in FIG. 3 so that the delay between the first stage and the second stage and the delay between the second stage and third stage are different. For another example, the number of delay control circuits changes as the number of stages changes. Accordingly, a different number of delay control circuits and a different number of inverters in the delay control circuits also fall within the contemplated scope of the present disclosure. Other circuits performing the corresponding functions of the circuits 40 to 45 are also within the contemplated scope of the present disclosure.

Figure 4:
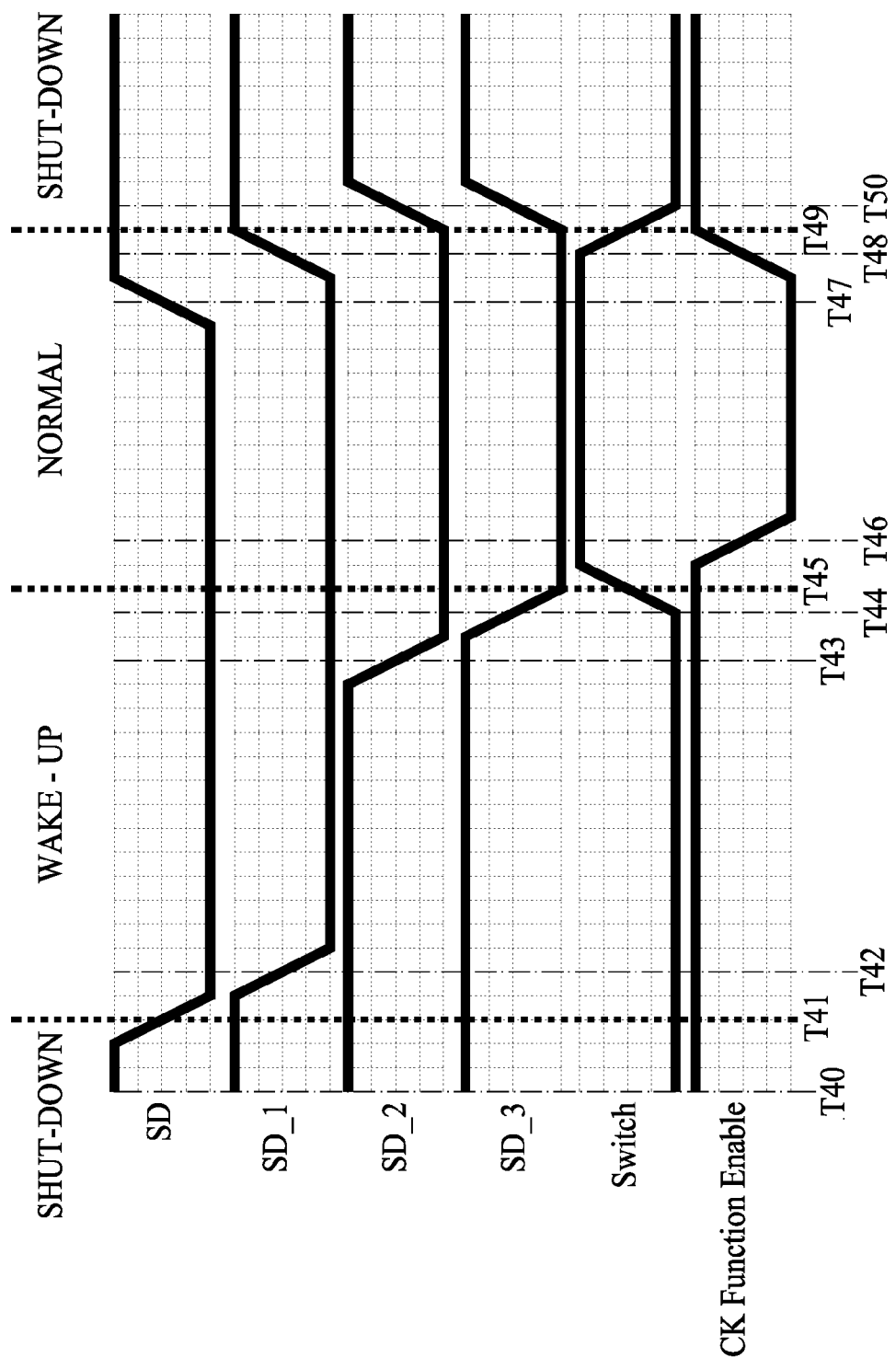
FIG. 4 shows illustrative signals corresponding to the circuit in FIG. 3, in accordance with some embodiments.

FIG. 4 shows illustrative signals corresponding to the exemplary circuit in FIG. 3, in accordance with some embodiments.

At time T40, the master control signal SD is logically high, and the memory macro 10 in FIG. 1 operates in the shut-down mode. By operation of delay control circuits 40 to 43, the control signals SD_1, SD_2 and SD_3 are logically high, which turn off headers HD71 to HD76 and HD81 to HD86. Moreover, by operation of the delay control circuits 40 to 44, the control signal Switch is logically low, which turns on the control devices CD17 to CD67 and CD18 to CD68 so that the power domains PD1 to PD8 associated with the control devices CD17 to CD67 and CD18 to CD68 are connected to each other. Further, by operation of the delay control circuits 40 to 45, the enable signal CK Function Enable is logically high, which disables the control circuits CK71 to CK76, CK81 to CK86 and CK1 to CK6 in the shut-down mode.

At time point T41, the master control signal SD is activated with a logical low value, and the memory macro 10, from the shut-down mode, enters into a wake-up mode. After a delay from time point T41 to time point T42 caused by the delay control circuit 40, the control signal SD_1 is activated with a logical low value at time point T42. The control signal SD_1 is applied to the header HD71 for the header HD71 to be conducting at the first stage.

After a delay from time points T42 to T43 caused by the delay control circuits 41 and 42, the control signal SD_2 is activated with a logical low value at time point T43. The control signal SD_2 is applied to the headers HD72, and HD73 for the headers HD72 and HD73 to be conducting in addition to the header HD71 at the second stage.

After a delay between time point T43 and time point T44 caused by the delay control circuit 43, the control signal SD_3 is activated with a logical low value at time point T44. The control signal SD_3 is applied to the remaining headers including HD74 to HD76 and HD81 to HD86 for the headers HD74 to HD76 and HD81 to HD86 to be conducting in addition to the headers HD71 to HD73 at the third stage. By the delay between time point T44 to time point T45, charging the power node by all the headers including HD71 to HD76 and HD81 to HD86 is completed, and the power domains PD1 and PD8 are ready to be disconnected for completion of the wake-up mode.

At time point T45, the control signal Switch is deactivated with a logical high value, which turns off the control devices CD17 to CD67 and CD18 to CD68, disconnects the power domains PD1 to PD8 associated with control devices CD17 to CD67 and CD18 to CD68, completes the wake-up mode, and begins a normal mode. Subsequently, after a delay from time T45 to time T46 caused by the delay control circuit 45, the enable signal CK Function Enable is activated with a logical low value at time point T46, which enables the control circuits CK17 to CK67, CK18 to CK68 and CK1 to CK6. As a result, the control circuits CK17 to CK67, CK18 to CK68 and CK1 to CK6 operate in their respective power domains PD7, PD8 and PD1 to PD6 in the normal mode.

For the memory macro 10 to enter into the shut-down mode, the master control signal SD is deactivated with a logical high value at time point T47. By operation of delay control circuit 40, the control signal SD_1 transitions accordingly at time point T48. By operation of delay control circuits 40 and 45, the enable signal CK Function Enable transitions accordingly at a time point substantially close to time point T48. When the enable signal CK Function Enable is deactivated, the control circuits CK71 to CK76, CK81 to CK86 and CK1 to CK6 are disabled. At time point T49, when the control signal Switch is activated with a logical low value, the control devices CD17 to CD67 and CD18 to CD68 are turned on, and the power domains PD1 to PD8 are connected together to be ready for the next wake-up mode. At time point T50, the control signal SD_2 and the control signal SD_3 are deactivated with a logically high value.

Power Management Mechanism, Additional Embodiments

Figure 5:
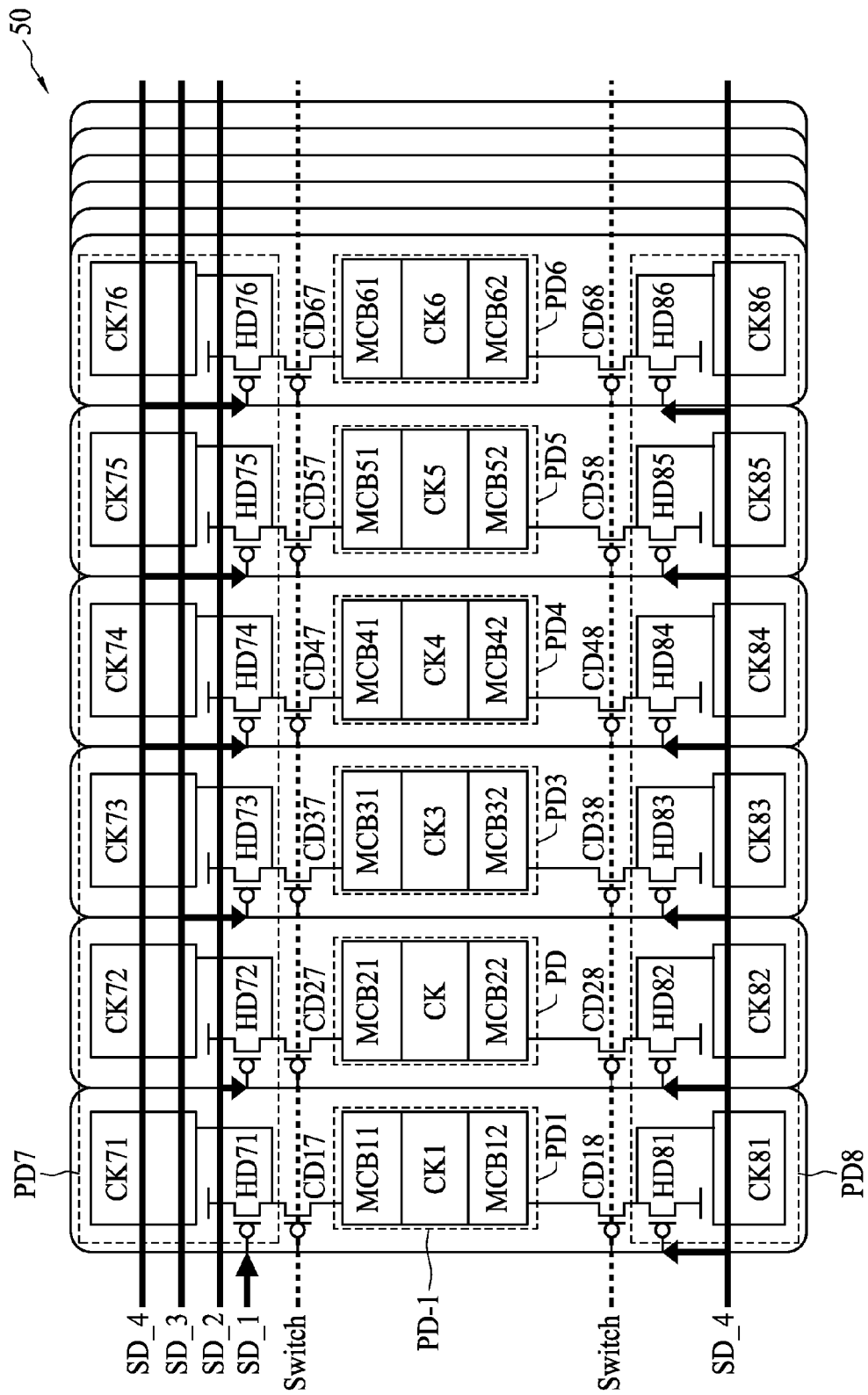
FIG. 5 is a circuit diagram of a memory macro built according to the number of stages in FIG. 6A, in accordance with embodiments.

FIG. 5 is a circuit diagram of a memory macro 50 built according to a simulation result in FIG. 6, in accordance with some embodiments. The memory macro 50 is different from the memory macro 10 in FIG. 1 in that the number of stages is four instead of three. In the memory macro 50, a header HD71, is configured to receive the control signal SD_1. A header HD72 is configured to receive the control signal SD_2. A header HD73 is configured to receive the control signal SD_3. Headers HD74 to HD76 and HD81 to HD86 are configured to receive a control signal SD_4.

Figure 6A:
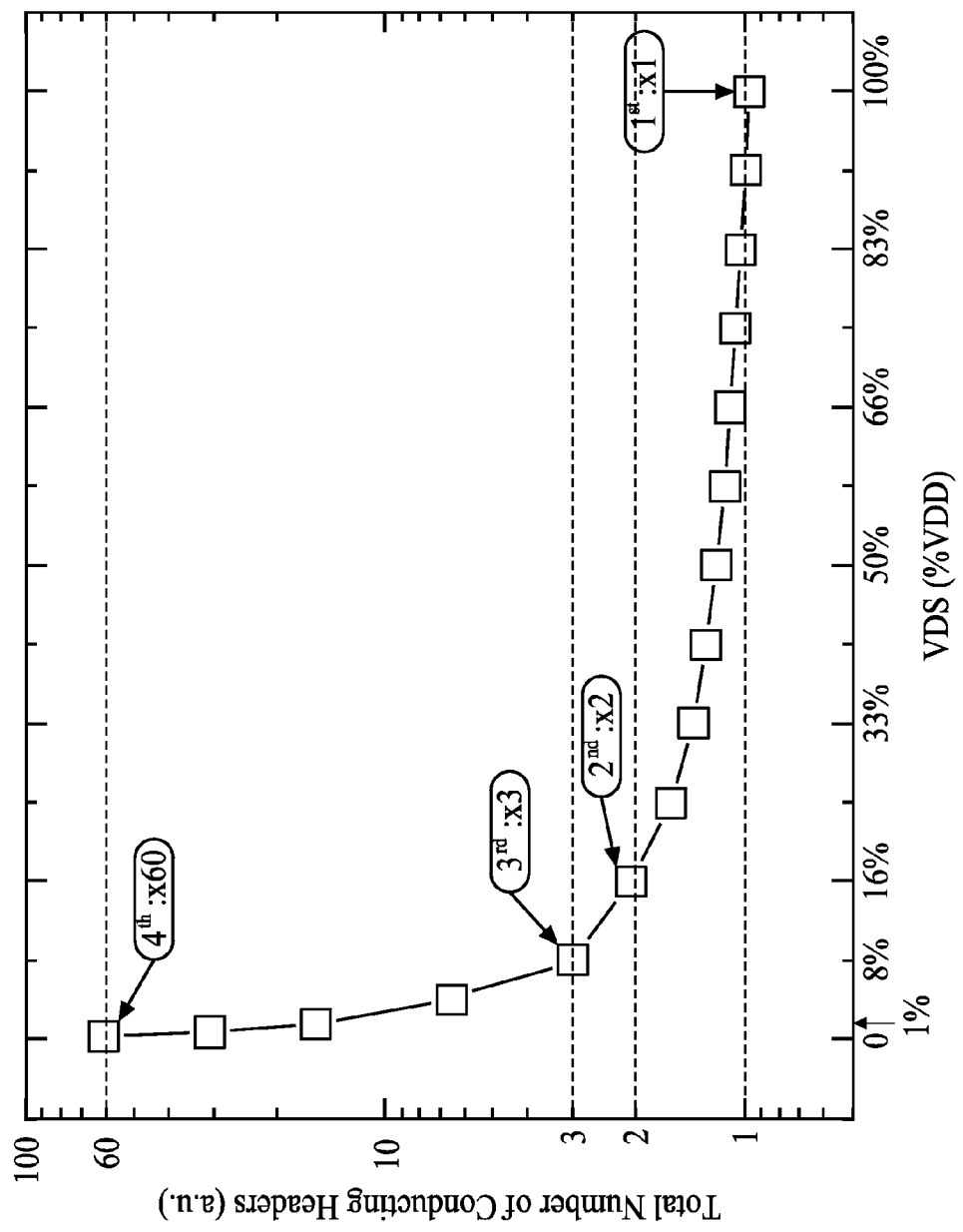
FIG. 6A is a graph showing a relationship between the number of headers to be turned on and VDS across a drain and source of each header in the memory macro of FIG. 5 based on a simulation, in accordance with some embodiments.

FIG. 6A is a graph 60 showing a relationship between the number of headers to be conducting in each stage and VDS across a drain and a source of the headers HD71 to HD76 and HD81 to HD86 in the memory macro 50 in FIG. 5 based on a simulation, in accordance with some embodiments. The graph 60 is different from the graph 20 in FIG. 2 in that an additional stage is introduced at VDS equals 16% of VDD. The effect of increasing the number of stages is discussed with reference to FIG. 6B.

Figure 6B:
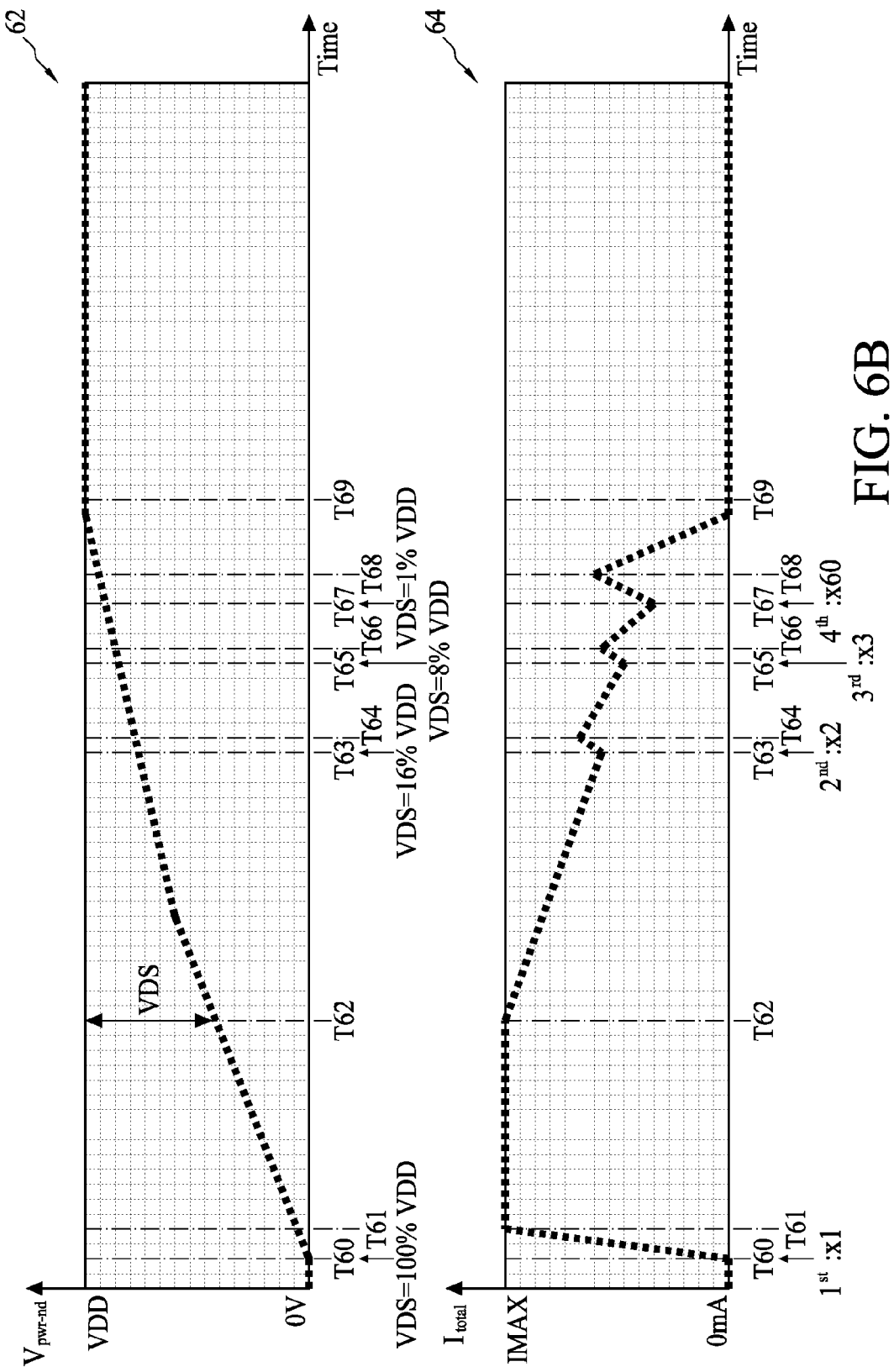
FIG. 6B are graphs showing a transition of a voltage of a power node during a wake-up mode and the corresponding total current in conducting headers of the memory macro in FIG. 5, in accordance with some embodiments.

FIG. 6B are graphs 62 and 64, in accordance with some embodiments. Graph 62 shows a transition of a voltage $V_{pwr\_nd}$ of the power nodes during a wake-up mode. Graph 64 shows the corresponding total current $I_{total}(m)$ flowing in the conducting headers of the memory macro 50 in FIG. 5, respectively. The graphs 62 and 64 are different from the corresponding graphs 22 and 24 in FIG. 2B. Up to the second stage in FIG. 6A, one header HD71 is turned on, and therefore, the transitions of $V_{pwr\_nd}$ and $I_{total}$ between time points T60 to T63 are the same as those between time points T20 to T23 in FIG. 2B. At the second stage, VDS of the header HD71 drops to 16% of VDD, and an additional header HD72 is turned on so that the total number of conducting headers HD71 and HD72 is two. The total current $I_{total}(m)$ rises initially from time point T63 to time point T64 and resumes dropping at time point T64. The third stage where an additional header HD73 is turned on occurs at time point T65 when VDS is 8% of VDD, and the total current $I_{total}(m)$ rises from time point T65 to T66, and resumes dropping at time point T66. The fourth stage where fifty seven additional headers including HD74 to HD76 and HD81 to HD86 are turned on occur at time point T67 when VDS is 1% of VDD, and the total current $I_{total}(m)$ rises from time point T67 to T68, and resumes dropping at time point T68. Charging the power nodes is completed at time point T69. Because of the additional stage at VSD being equal to 16% of VDD, the time points T65 to T69 corresponding to VDS equal to 8% of VDD to 0% of VDD, happens earlier than time points T23 to T27 corresponding to VDS equal to 8% of VDD to 0% of VDD in FIG. 2. Because the area under the curve of $I_{total}(m)$ stays the same regardless of the number of stages, and with the additional area for the second stage, the area for the third and fourth stages is smaller compared to the area for the second and third stages in FIG. 2. As a result, the powers nodes are charged to VDD faster.

Figure 7:
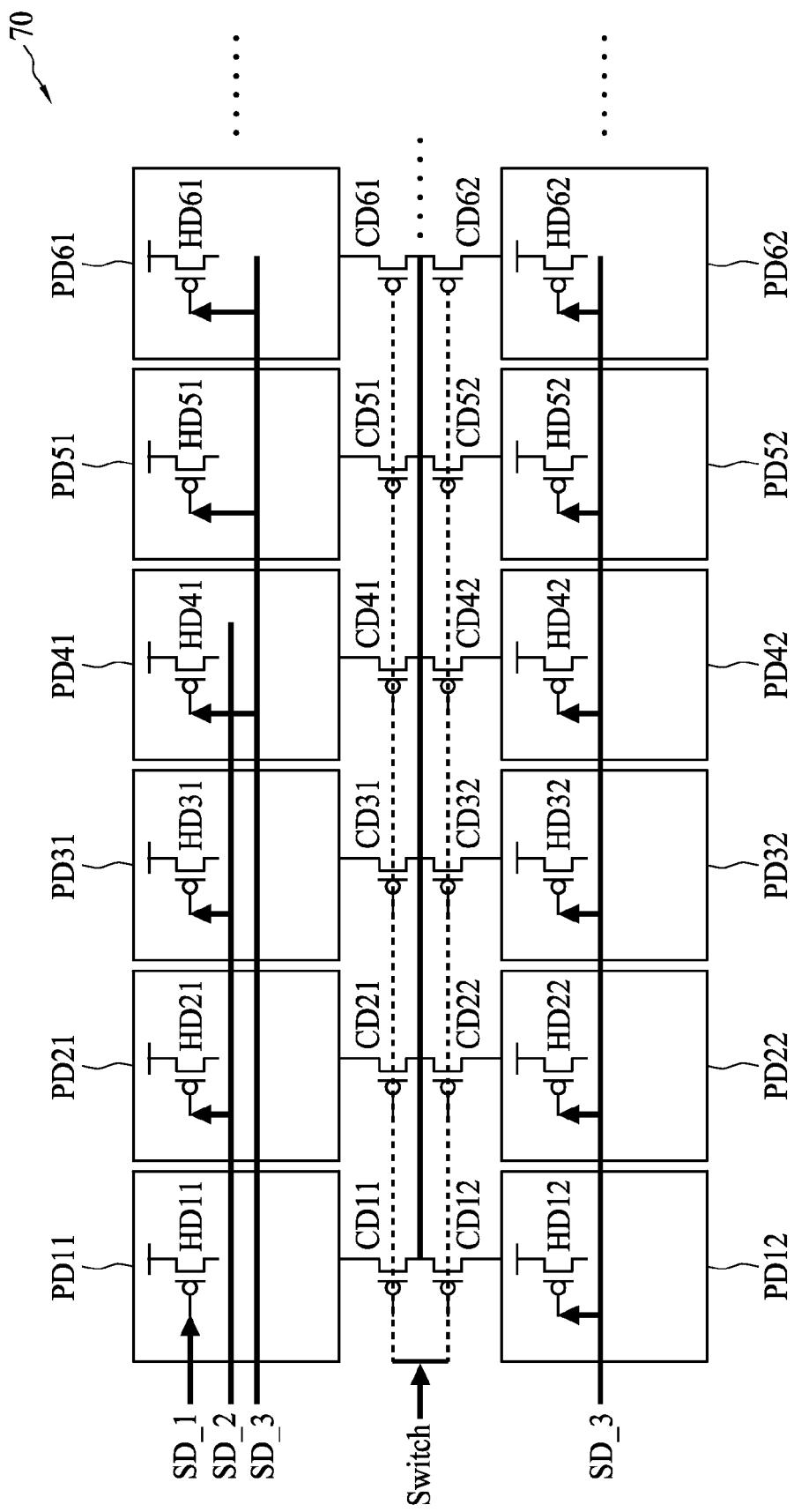
FIG. 7 is a schematic diagram of a device, in accordance with additional embodiments.

FIG. 7 is a schematic diagram of a device 70, in accordance with some embodiments. Compared with the embodiments in FIG. 1 and FIG. 6, in the device 70, the headers HD11 to HD61 and HD12 to HD62 correspond to different power domains PD11 to PD 61 and PD12 to PD62, respectively. In order to connect all the power domains together in a wake-up mode, control devices CD11 and CD12, to CD 61 and CD62 connect the power domains PD11 and PD12, to PD61 and PD62, while drains of control devices CD 11 to CD61 and CD 12 to CD62 are coupled together to connect the power domains PD11 to PD61 and PD12 to PD62.

In FIG. 7, gates of the control circuits CD11 to CD61 are configured to receive a control signal Switch, sources of the control circuits CD11 to CD61 are connected to the power domains PD11 to PD61, respectively, and drains of the control circuits CD11 to CD61 are connected to each other. Likewise, gates of the control circuits CD12 to CD62 are configured to receive the control signal Switch, sources of the control circuits CD12 to CD62 are connected to power domains PD12 to PD62, respectively, and drains of the control circuits CD12 to CD62 are connected to each other and to the drains of control circuits CD11 to CD61.

Further, the header HD11 in the power domain PD11 is configured to receive a control signal SD_1. The headers HD21, HD31 and HD41 in the power domains PD21, PD31 and PD41, respectively, are configured to receive a control signal SD_2. The headers HD51, HD61 and HD12 to HD62 in the remaining power domains PD51, PD61 and PD12 to PD62, respectively are configured to receive a control signal SD_3. In operation, when the device 70 enters into a wake-up mode from the shut-down mode, the control signal Switch is still activated with a logical low value, which causes the control devices CD11 to CD61 and CD12 to CD62 to remain conducting. As a result, the power domains PD11 to PD61 and PD12 to PD62 are connected to each other. Then the headers HD11 to HD 61 and HD12 to HD62 are turned on stage by stage in response to the activation of the control signals SD_1, SD_2 and SD_3. When the device 70 enters into a normal mode from the wake-up mode, the control signal Switch is deactivated with a logical high value, which turns off the control devices CD11 to CD61 and CD12 to CD62. As a result, the power domains PD11 to PD61 and PD12 to PD62 are separated from each other. Then, the control circuits (not shown) associated with the power domains PD11 to PD61 and PD12 to PD62 are enabled and operate in their respective power domains. Further, before the device 70 enters into the shut-down mode from the normal mode, the control circuits associated with the power domains PD11 to PD61 and PD12 to PD62 are disabled. Then, the control signal Switch is activated with a logical low value, which turns on control devices CD11 to CD61 and CD12 to CD62. As a result, the power domains PD11 to PD61 and PD12 to PD62 are connected to each other to be ready for the next wake-up mode.

Method of Power Management

Figure 8:
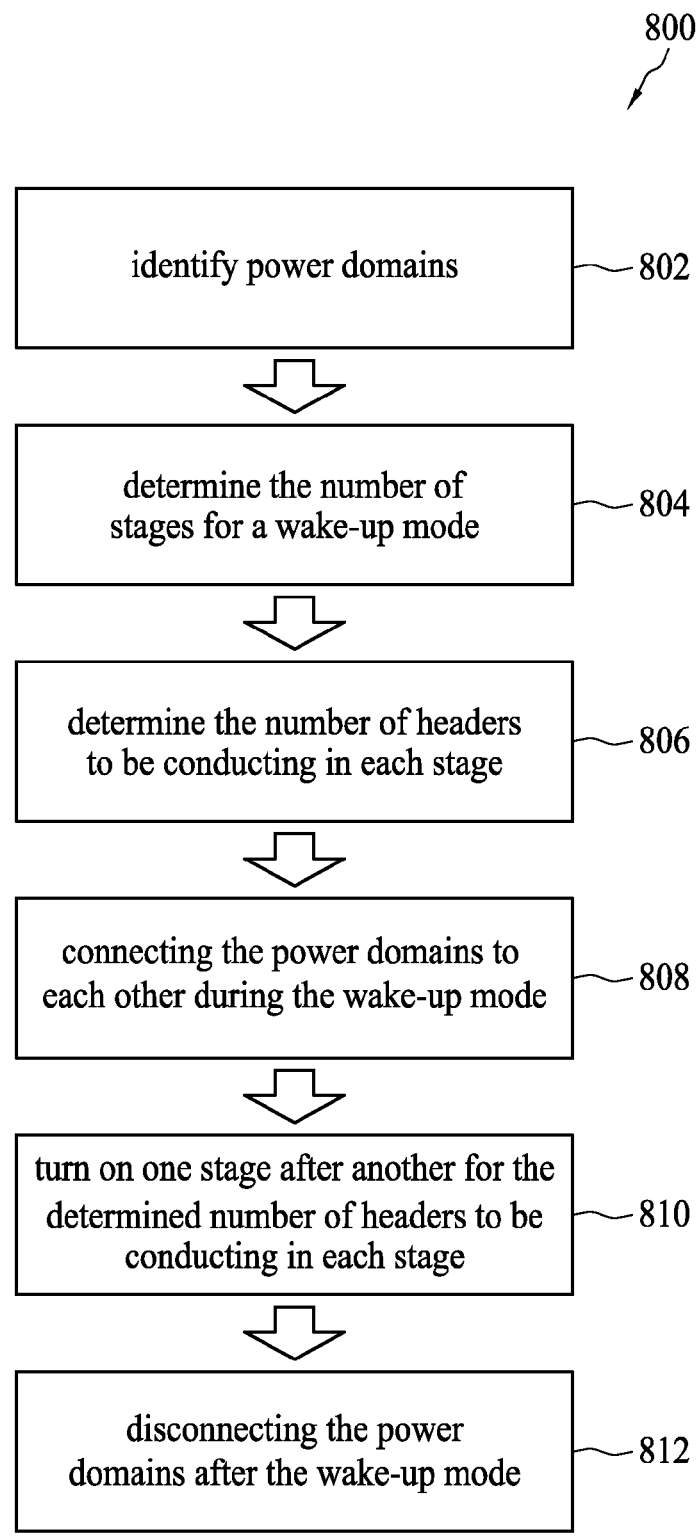
FIG. 8 is a flow diagram illustrating a method of power management, in accordance with some embodiments.

FIG. 8 is a flow diagram illustrating a method 800 of power management, in accordance with some embodiments. As an example, the memory macro 10 in FIG. 1 is used. The method 800 also applies to the memory macros 50 in FIG. 5 and the device 70 in FIG. 7.

In operation 802, power domains in memory macro 10 are identified. For example, power domains PD1 to PD8 in memory macro 10 are identified.

In operation 804, the number of stages used in a wake-up mode is determined. As an example, based on the simulation result of FIG. 2A, three stages are used. As another example, based on the simulation result of FIG. 6A, four stages are used.

In operation 806, the number of headers to be conducting at each stage is determined. As an example, based on the simulation result of FIG. 2A, the number of headers to be conducting at first, second and third stages are 1, 3 and 60, respectively. As another example, based on the simulation result of FIG. 6A, the number of headers to be conducting at first, second, third and fourth stages are 1, 2, 3 and 60, respectively.

In operation 808, the power domains PD1 to PD8 are connected to each other by a number of control devices CD17 to CD67 and CD18 to CD68 during the wake-up mode. In some embodiments, for example the embodiments with reference to FIG. 7, the number of power domains PD11 to PD61 and PD12 to PD62 is equal to the number of control devices CD11 to CD61 and CD12 to CD62.

In operation 810, for the determined number of headers to be conducting at each stage, the stages are turned on one stage after another.

In operation 812, the power domains PD1 to PD8 are disconnected from each other after the wake-up mode so that memory macro 10 enters a normal mode.

In some embodiments of the present disclosure, in a method, power domains in a device are identified. The power domains are connected to each other by a number of control devices during a wake-up mode of the device. The power domains are disconnected after the wake-up mode of the device.

In some embodiments of the present disclosure, in a method, power domains in a device are identified. A number of stages for a wake-up mode associated with the device are determined. A number of conducting headers in each stage is determined. The power domains are connected to each other during the wake-up mode of the device. One stage is turned on after another stage.

In some embodiments of the present disclosure, a device comprises a number of power domains and a number of control devices. The control devices are connected together to receive a control signal and configured to connect the power domains to each other during a wake-up mode of the device and configured to disconnect the power domains after the wake-up mode of the device.

A number of embodiments of the disclosure have been described. It will nevertheless be understood that various modifications may be made without departing from the spirit and scope of the disclosure. For example, some transistors are shown to be N-type and some others are shown to be P-type, but the disclosure is not limited to such a configuration. Embodiments of the disclosure are applicable in variations and/or combinations of transistor types. Additionally, some signals are illustrated with a particular logic level to operate some transistors (e.g., activated high, deactivated low, etc.), but selecting such levels and transistors are also a matter of design choice, and embodiments of the disclosure are applicable in various design choices.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A method, comprising:
   electrically connecting power domains in a device to one another by a number of control devices during a wake-up mode of the device, the device comprising circuits each in a corresponding one of the power domains, and the circuits being disabled during the wake-up mode of the device;
   electrically disconnecting the power domains from one another by the number of control devices during a normal mode after the wake-up mode of the device; and
   enabling the circuits in the normal mode.

2. The method of claim 1, wherein the control devices comprise transistors and gates of the transistors are electrically connected together to receive a control signal.

3. The method of claim 1, wherein the control devices are electrically connected to headers in the power domains, and during the wake-up mode, the method further comprises:
   generating a first control signal and applying the first control signal to turn on a first number of the headers; and
   generating a second control signal and applying the second control signal to turn on a second number of the headers.

4. The method of claim 3, wherein the first number and the second number are based on a total current of conducting headers with reference to a predetermined current.

5. The method of claim 3, wherein the second control signal is generated after the first control signal by an amount of delay.

6. A method, comprising:
   determining a number of stages for a wake-up mode associated with a device, the device comprising a plurality of power domains, a plurality of power nodes corresponding to the plurality of power domains, and a plurality of headers between a power supply and one or more of the power nodes;
   determining a number of conducting headers of the headers in each stage;
   electrically connecting the power nodes of the power domains to one another during the wake-up mode of the device; and
   turning on the number of headers in each stage one stage after another stage to charge the power nodes in the wake-up mode.

7. The method of claim 6, wherein the number of headers turned on in each stage is based on a total current of the number of conducting headers with reference to a predetermined current.

8. The method of claim 7, wherein a number of conducting headers is determined by:
   for a range of a voltage across drains and sources of the headers, determining the number of conducting headers such that a total current of the conducting headers is less than a predetermined current; and
   identifying points in the range of voltage across drains and sources of the headers at which the corresponding headers for different stages can be turned on.

9. The method of claim 6, wherein turning on the number of headers in each stage one stage after another stage comprises:
   generating a first control signal at a first stage of the number of stages and applying the first control signal to turn on a first number of headers in the first stage; and
   generating a second control signal at a second stage of the number of stages and applying the second control signal to turn on a second number of headers in the second stage.

10. The method of claim 9, wherein the second control signal is generated after the first control signal by an amount of delay.

11. The method of claim 6 further comprising electrically disconnecting the power nodes of the power domains from one another during a normal mode after the wake-up mode of the device.

12. The method of claim 11 further comprising:
   disabling circuits of the power domains during the wake-up mode and enabling the circuits in the normal mode.

13. The method of claim 6, wherein electrically connecting the power nodes of the power domains to one another is by a number of control devices.

14. The method of claim 13, wherein the control devices comprise transistors, and gates of the transistors are electrically connected together to receive a control signal.

15. A device, comprising:
   a number of power domains;
   a plurality of circuits each in a corresponding one of the power domains;
   a number of control devices configured to electrically connect the power domains to one another during a wake-up mode of the device and electrically disconnect the power domains from one another during a normal mode after the wake-up mode; and
   a control circuit configured to cause the circuits to be disabled during the wake-up mode, and cause the circuits to be enabled in the normal mode.

16. The device of claim 15 further comprising, in the power domains, headers connected to the control devices.

17. The device of claim 16, wherein a first number of the headers are configured to be turned on by a first control signal during the wake-up mode, and a second number of the headers are configured to be turned on by a second control signal during the wake-up mode.

18. The device of claim 17, wherein the first number and the second number are based on a total current of conducting headers with reference to a predetermined current.

19. The device of claim 17, wherein the second control signal is generated after the first control signal by an amount of delay.

* * * * *